331-98 CROSS REFERENCE SEARCH ROOM

May 14, 1963 C. B. MAYER 3,090,016
BROADBAND MATCHING CIRCUIT
Filed April 13, 1959

Inventor:
Charles B. Mayer,
by Richard R. Brainard
His Attorney.

3,090,016

BROADBAND MATCHING CIRCUIT

Charles B. Mayer, Scotia, N.Y., assignor to General Electric Company, a corporation of New York Filed Apr. 13, 1959, Ser. No. 805,977
8 Claims. (Cl. 333—33)

Figures 1, 2, 3, 4, 5, 6:
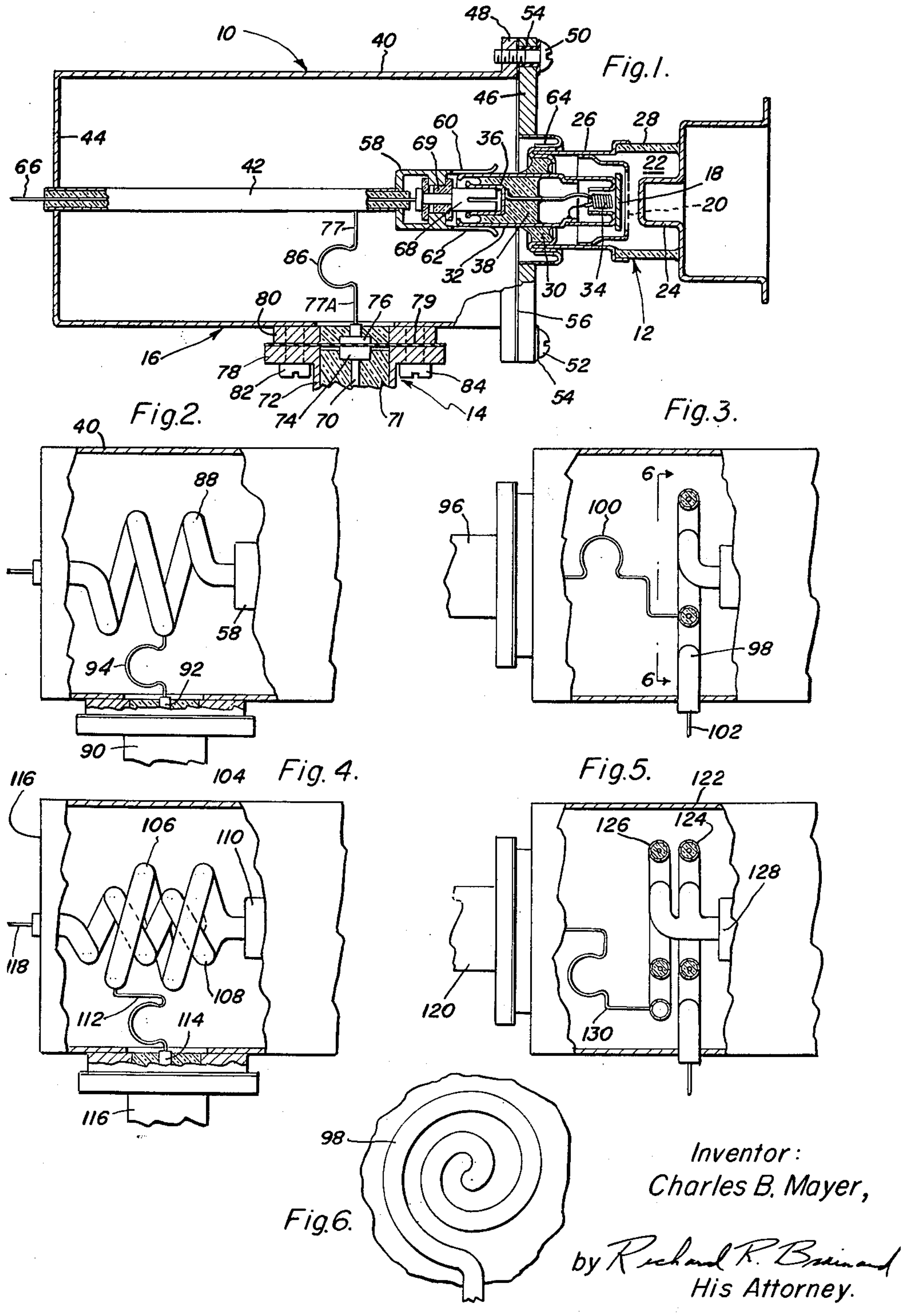

This invention relates to an electrical coupling device for establishing maximum energy transfer between electrical circuit components over a relatively broad band of frequencies.

For most efficient and effective performance of electronic or electrical circuit apparatus, it is usually necessary to provide impedance matching between energy propagating components thereof. That is, in transferring energy between components as, for example, between an electron tube input or output circuit and a corresponding input or output line, maximum energy is transferred if the coupling device effects impedance matching between these respective circuits. Matching occurs when the impedance presented to each component is the complex conjugate of the impedance presented by it, whereby the net result of such coupling is to present an effective impedance to currents flowing in the circuits, equal to twice the resistive component of either impedance. Under these conditions, maximum energy is transferred between circuits. Thus, in a circuit having an impedance that is inductive to a predetermined extent, for matching, the connected circuit is of the same value of impedance and capacitive to this same predetermined extent. Exact matching between circuits can be achieved for only one frequency and at frequencies removed from the matched frequency, the total circuit presents either an inductive or capacitive impedance. However, under proper conditions, within a limited band of frequencies removed from the exactly matched frequency, the inductive or capacitive component of impedance can be made insignificantly small so that the circuits are considered matched over this broad band for all practical purposes. Thus, in this application such effects are termed broadband matching.

Frequently, an apparatus input circuit presents an effective impedance comprising a parallel connection of a resistor and capacitor. Typical of such apparatus is the well-known 2C39 disk seal electron tube. Since such apparatus is operable over relatively broad frequency bands, it is also frequently important or necessary in circuits of the type mentioned, to establish a maximum energy transfer or an optimum coupling between circuit components over a relatively broad band of frequencies.

Impedance matching between circuits is a well-known expedient. However, a frequent difficulty of known matching arrangements for circuits of the above-mentioned type is that they are unduly large, heavy and expensive and are effective over only relatively narrow frequency bands.

It is, therefore, a principal object of my invention to effect improved impedance matching in circuits involving the type presenting a parallel connection of a resistor and capacitor.

It is a further object of my invention to effect improved impedance matching between circuits at any one of a broad band of frequencies.

It is a further object of my invention to achieve improved impedance matching utilizing apparatus that is small, compact and light relative to previously utilized matching apparatus.

In accordance with my invention, impedance matching between a resistive input line and an apparatus input circuit presenting a parallel combination of resistance and capacitance as an effective circuit, is achieved by interposing a coupling circuit presenting an effective inductance connected in parallel with the apparatus capacitance to produce a resonant tank circuit at the band of operating frequencies and by further presenting an effective series resonant circuit between the line and an appropriate coupling to the parallel connected inductive element. As a feature of my invention, the inductive elements are controllably, inductively coupled to each other to facilitate precise matching. According to a novel construction, the advantages of my invention are incorporated in circuits having distributed parameters rather than lumped parameters. With this arrangement, the positive or inductive reactance presented by the established parallel resonant circuit at frequencies below resonance and the negative or capacitive reactance at frequencies above resonance are compensated for by the respective negative and positive reactances presented by the series resonant circuit at frequencies greater and lower than resonance, respectively. Thus, an impedance approaching an effective pure resistance is presented as the impedance in the coupling circuit. According to a feature of my invention, the controllable mutual coupling between inductors enables fine control over the coupling between the component circuits to control the impedance matching.

The novel features believed characteristic of the invention are set forth in the appended claims. The invention itself, together with further objects and advantages thereof may best be understood with reference to the drawing in which:

FIG. 1 is a cross sectional elevation showing one form of my invention,

FIG. 2 is a partially cut away view showing the essential elements according to another form of my invention, FIG. 3 is a partially cut away view showing the essential elements according to another form of my invention, FIG. 4 is a partially cut away view showing the essential elements according to another form of my invention, FIG. 5 is a cut away view showing the essential elements according to another form of my invention, and FIG. 6 is a detailed view taken along line 6—6 in FIG. 3 and showing an inductive element therein.

Referring now more particularly to FIG. 1 of the drawing, 10 represents generally the entire apparatus embodying my invention and includes an electron tube of the disk seal type represented generally at 12, an input line of the coaxial type represented generally at 14, and a coupling apparatus represented generally at 16 disposed between the input line and the tube.

The essential elements of tube 12 are the cathode 18 coated with a suitable emission enhancing material, a control grid 20 contained in an evacuated region 22 and an anode 24 having a surface facing the cathode and being on the side of grid 20 remote from the cathode. The region 22 is partially bounded by a cylindrical member 26 which is attached to and supports the grid 20 and telescopically interfits with a ceramic cylindrical insulating member 28 secured to the member 26 and to the anode 24 for maintaining the same in predetermined spaced relationship. A ceramic insulating member 30 is disposed between the grid supporting member 26 and a cathode supporting tube 32 and is secured to each by a suitable bond. The interior of tube 32 contains a heater 34 electrically energizable to raise the temperature of cathode 18 to a point of copious thermionic emission. The ends of the heater are connected to the tube 32 on the one hand and to a thimble shaped, conductive contact member 36 on the other hand. The contact member 36 is supported in spaced relationship from the tube by a ceramic insulator 38 secured within the tube 32 and surrounding member 36. The insulator 38 is preferably bonded to parts in contact therewith.

In accordance with this construction, the input circuit between the cathode and grid of this tube presents an impedance having as an equivalent circuit, a resistor and capacitor in shunt when the grid is grounded at radio frequency potentials. In accordance with my invention, for resonating the capacitance, an effective inductance is shunted thereacross. The physical manifestation of such inductance comprises the coaxial cavity including an outer conductor 40 and an inner conductor 42 terminating at one end in a short circuiting wall 44 interconnecting the conductors. At the other end, the cavity is closed by an end wall 46 secured in closely spaced relation to a flange 48 of the cavity but insulated therefrom. Screws such as shown at 50 and 52 are insulated from wall 46 by suitable insulating bushings as shown at 54 and an annular insulating strip 56 of mica or other suitable insulating material is disposed between the flange 48 and wall 46.

The inner end of inner conductor 42 terminates in a conductive socket 58 connected to the conductor 42 and having a plurality of resilient fingers as shown at 60 and 62 for frictionally engaging the end of tube 32 of electron tube 12. The socket 58 together with another socket 64 formed in wall 46 for receiving and contacting grid supporting member 36, are effective for supporting the electron tube in operating position. Heating current for heater 34 is supplied through an inner conductor 66, coaxial with conductor 42, and extending into conductive contact with a terminal 68 which is secured in position by an insulator 69 mounted in the interior of the socket 58 and which is insertable in the recessed contact 36. Heater current return is provided through tube 32, contacts 60 and 62 and conductor 42.

Energy is fed to the input circuit of electron tube 12 through line 14 and for blocking direct currents from passage to or from the line 14, the inner conductor 70 and outer conductor 72 which are separated by a suitable dielectric material 71, are insulated from but closely spaced to members coupled to the cathode 18 and grid 20, respectively, to form a blocking capacitor therebetween. Thus, inner conductor 70 terminates in an enlarged conductive member 74 closely spaced to another enlarged conductive member 76 and outer conductor 72 terminates in a flange 78 closely spaced to a block 80 conductively mounted on the cavity 40. Suitable insulating material 79, such as mica, is disposed between respective conductive members. Suitable bolts or screws 82 and 84 may be provided for attaching the input line and are insulated from either flange 78 or block 80 or from both thereof. The bolts 82 and 84 may conveniently be made of a suitable insulating material. Accordingly, the outer conductor 72 of line 14 is capacitively coupled at radio frequencies to grid 20 through the effective capacitors formed by flange 78 and block 80 and by flange 48 and wall 46.

In accordance with my invention, for coupling input energy to the electron tube, conductive member 76 in turn is connected to conductor 42 through a novel connector shown at 86. The connector 86 consists of an arcuate or loop portion of somewhat less than 360° extent, the ends of which are interconnected with the respective conductors 42 and 76 through extensions 77 and 77A.

Further in accordance with my invention, the connection of cavity 40 across the grid-cathode input circuit of electron tube 12 effectively impresses an inductive reactance in parallel with the existing grid to cathode capacitance shunted by grid to cathode resistance of the tube circuit. The circuit so formed is parallel resonant at a predetermined frequency and to interpose a compensating impedance effect to that of the parallel resonant circuit at frequencies removed from the predetermined frequency, the loop of connector 86 and the series connected capacitor formed by elements 74 and 76 are series resonant at the predetermined frequency. Thus, at frequencies removed from the predetermined frequency, respective reactances of the two circuits are opposite in sign and substantially equal in magnitude whereby a substantially pure resistive impedance is presented at the line 14.

For impedance matching purposes, the loop connector 86 is connected to conductor 42 at a point where the impedance presented in the path to the electron tube is substantially the same as that presented in the path to the line 14. However, in the event of misapplication of this point of contact or due to inaccuracies occurring in the system, mismatching to slight extents may occur and in accordance with a further feature of my invention, to correct for such slight mismatching, the loop of connector 86 is orientable so as to control the coupling between the loop and the cavity 40. The effect of such orientation is the electrical equivalent to more precise disposition of the point of interconnection between the connector 86 and conductor 42. To allow for such orientation, the material of connector 86 is preferably pliable and ductile, however, in the usual circumstances only slight adjustment is necessary for proper matching and materials such as copper may be used.

In accordance with another embodiment of my invention, as shown in FIG. 2 of the drawings, the inner conductor 88 of the coaxial cavity and corresponding to inner conductor 42 as shown in FIG. 1, is formed in a helical contour whereby the axial extent of the cavity is shortened making the coupling more compact and light in weight. The loop containing connector between a coaxial input line 90 and the electron tube input circuit, the details of which are omitted, includes a connection from the inner conductor 92 of the input line to a suitable point on the surface of helix 88. In other respects, the embodiment of invention shown in FIG. 2 is identical with that shown in FIG. 1 and for purposes of clarity and brevity a detailed description thereof is omitted. In the manner entirely similar and analogous to that set forth and described with respect to FIG. 1, the connector 94 in FIG. 2 is orientable so as to control the inductive coupling between this loop and the inductance of the coaxial cavity whereby a precise and accurate matching between the line 90 and the tube input circuit is achieved.

In accordance with another embodiment of my invention as shown in FIGS. 3 and 6 of the drawings, another compact arrangement is facilitated by a spiral rather than linear or helical contour of the inner conductor of the coaxial cavity. Thus, the cavity may be made even shorter than in the embodiment shown in FIG. 2. In this event, the input line designated at 96 approaches the cavity from the end thereof rather than from the side as shown in FIGS. 1 and 2 and according to a feature of my invention, the connection between the input line 96 and the inner conductor designated 98 is made through a connector 100 having as a portion thereof a loop forming a series resonant circuit at the frequency of resonance of the effective parallel resonant circuit formed by the inductance of the cavity and the parallel connected input circuit capacitance. Heater current, in this event, is supplied through an inner wire 102 extending through the spiral 98 in insulating relation thereto and leading to the heater winding within the electron tube. In this arrangement, the loop of connector 100 may be oriented for appropriate inductive coupling with the coaxial cavity for refinement in matching.

Under certain circumstances it may occur that the impedance of the input line is greater than the impedance of the input or grid cathode circuit of the tube. In this event, a "step down" matching is required and in accordance with an embodiment of my invention shown in FIG. 4, this may be achieved by the arrangement of inner conductors shown therein and the interconnection between these inner conductors and the electron tube input circuit and the input line. For purposes of clarity and brevity, the details of the tube are omitted in the figure of the drawing inasmuch as the same are identical to that shown and described in FIG. 1.

The outer conductor of coaxial cavity in FIG. 4 is designated by 104 and the inner conductors in helical form, are designated as 106 and 108 respectively. Conductor 108 extends from the socket 110, corresponding to socket 58 in FIG. 1, and terminates in a connection to a connector 112 including an arcuate loop, the other end of which is connected to the inner conductor 114 of a coaxial line 116. The other helical conductor, 108, extends from the socket 110 to the shorting wall 116 of the cavity and for supplying heater current to the electron tube, a conductor 118 extends in insulating relationship through the conductor 108. In this embodiment of invention, the impedance of the input line 116 is greater than that of the electron tube and by the cooperative coupling between helices 106 and 108, these respective impedances are matched. In accordance with my invention as shown in FIG. 4, the loop of connector 112 is orientable for controlling the extent of coupling between the coaxial line 116 and the coaxial cavity 104 and thus, a refinement or precise matching between the circuits may be achieved.

In accordance with still another embodiment of my invention as shown in FIG. 5 of the drawings, a "step down" in impedance matching from an input line 120 to the electron tube input circuit may be achieved with a spiral arrangement of a pair of inner conductors in a coaxial cavity 122 rather than a helical arrangement. The inner conductors 124 and 126 of the coaxial cavity are each connected at one end to a socket 128 similar to socket 58 in FIG. 1 and at the other ends are connected, respectively, to a wall of the outer conductor 122 of the coaxial cavity and to the blocking capacitor associated with the conductor of coaxial line 120 through a connector 130. The connector 130 includes an arcuate loop having the characteristics of a series resonant circuit at the microwave frequencies to be employed. The response of the series resonant circuit formed by the loop of connector 130 is such as to compensate for the effect of the parallel resonant circuit formed by the inner lines of the coaxial cavity with the input circuit capacitance. For matching the relatively high impedance of the line 120 to the relatively low impedance of the electron tube input circuit, an additional transformation is achieved by the use of the pair, rather than a single spiral inner conductor. The coupling between inner conductors 124 and 126 is effective to achieve such transformation. In the embodiment of invention shown in FIG. 5, the loop of the connector 130 is adapted to be oriented for more precise matching between the line 120 and the coaxial cavity 122 in the manner described hereinabove with respect to other embodiments of the invention.

While the present invention has been described by reference to particular embodiments thereof, it will be understood that numerous modifications may be made by those skilled in the art without actually departing from the invention. I, therefore, aim in the appended claims to cover all such equivalent variations as come within the true spirit and scope of the foregoing disclosure.

What I claim as new and desire to secure by Letters Patent of the United States is:

1. A coupling apparatus for coupling one end of a resistive line to a circuit presenting an effective impedance having a parallel connected resistance and capacitance comprising a cavity providing an inductive element connected across said circuit to form a tank circuit resonant at a predetermined frequency, a second inductive element and a capacitive element connected in series with said second inductive element to provide a circuit series resonant at said predetermined frequency, said inductive element being conductively connected to said cavity as well as being physically supported in said cavity in inductive relation to the inductive element of said cavity to provide inductive coupling therebetween.

2. A coupling apparatus for coupling one end of a resistive line to a circuit presenting an effective impedance having a parallel connected resistance and capacitance comprising a coaxial cavity having the respective inner and outer conductors connected to the respective terminals of said circuit, a connector including a loop in series with a capacitor and presenting a series resonant circuit connected between one conductor of said line and the inner conductor of said coaxial cavity and means for controlling the inductive coupling between the loop of said connector and said cavity to achieve an impedance matching between the impedance of said circuit and the impedance of said line.

3. A coupling apparatus for coupling one end of a resistive line to a circuit presenting an effective impedance having a parallel connected resistance and capacitance comprising a coaxial cavity having one conductor connected to one terminal of said circuit and the other conductor connected to the other terminal of said circuit and impressing an effective inductance across said circuit to form a parallel resonant tank circuit with the capacitance of said circuit, means connected between said line and a point on the inner conductor of said cavity and having inductive and capacitive properties to form a series resonant circuit at the frequency of said parallel resonant circuit, said last mentioned means being controllably inductively coupled to the coaxial cavity to effect an adjustable and precise matching between said line and said circuit.

4. A coupling apparatus for coupling one end of a resistive line to a circuit presenting an effective impedance having a parallel connected resistance and capacitance comprising a coaxial cavity having an outer hollow conductor connected to one terminal of said circuit and an inner helical conductor connected at one end to the other terminal of said circuit, the other ends of said helical conductor and said outer conductor being shorted, means establishing coupling between one conductor of said line and a point on said helical conductor and comprising an inductive loop in series with a capacitor to present a series resonant circuit at a frequency of operation of said apparatus, said means including a loop orientable to control the extent of inductive coupling between said cavity and said input line.

5. A coupling apparatus for coupling one end of a resistive line to a circuit presenting an effective impedance having a parallel resistance and capacitance, comprising an inductive cavity including an outer hollow conductor connected to one terminal of said circuit and an inner spirally wound conductor connected to the other terminal of said circuit at one end thereof the other end of said spirally wound conductor being connected to a wall of said outer conductor, connector means including an inductive loop connected in a series with a capacitor and being resonant at a frequency of operation of said apparatus and being connected between said input line and a point on said spiral conductor, said loop being orientable to control the extent of inductive coupling between said cavity and said input line for precise matching therebetween.

6. A coupling apparatus for coupling one end of a resistive line to a circuit presenting an effective impedance having a parallel connected resistance and capacitance, comprising a coaxial cavity including an outer hollow conductor connected to one terminal of said circuit, an inner conductor within said outer conductor and being connected to the other terminal of said circuit, said inner conductor being in the form of a helix terminating within said outer conductor, a second inner conductor connected to said other terminal of said circuit and being helically wound within the first mentioned helix and being connected at its other end to a wall of said cavity, means for coupling said line to said circuit and including a loop connector having inductive properties in series with a capacitor and being series resonant at a frequency of operation of said apparatus and being connected between a conductor of said input line at a point on the outer helix within said outer conductor, said loop being orientable to control the degree of inductive coupling between said line and said cavity.

7. A coupling apparatus for coupling one end of a resistive line to a circuit comprising an effective impedance having a parallel connected resistance and capacitance comprising a coaxial cavity having an outer conductor connected to one terminal of said circuits, an inner conductor having one end connected to the other terminal of said circuit and being spirally wound within said outer conductor, the other end of said inner conductor being conductively connected to one wall of said outer conductor, a second inner conductor having one end connected to said other terminal of said circuit and being spirally wound in a plane adjacent to and substantially parallel with the plane of said first spirally wound inner conductor, the other end of said second inner conductor being connected to said input line through a coupling connector including an inductive loop and a series connected capacitor being resonant at a frequency of operation of said apparatus, said loop being orientable to control the extent of inductive coupling between said input line and said cavity.

8. A coupling system for coupling energy between the inner and outer conductors of a first concentric transmission line and a pair of electrodes of an electric discharge device comprising a second concentric transmission line coupling at one end to the electrodes and terminating in a short circuit at a point spaced from the point of connection with the electrodes, an inductive coupling loop connected with an intermediate point on the inner conductor of said second transmission line inductively related to the inductance provided by said second concentric transmission line and terminating in an element capacitively coupled with the inner conductor of said first-mentioned concentric transmission line, and means connecting the outer conductors of said transmission lines.

References Cited in the file of this patent

UNITED STATES PATENTS

| | | |
|---|---|---|
| 2,284,529 | Mason | May 26, 1942 |
| 2,489,433 | Rambo | Nov. 29, 1949 |
| 2,501,052 | Herlin | Mar. 21, 1950 |
| 2,524,532 | Linder | Oct. 3, 1950 |
| 2,748,276 | Gaffney et al. | May 29, 1956 |
| 2,752,494 | Finke | June 26, 1956 |
| 2,763,842 | Olive | Sept. 18, 1956 |
| 2,771,516 | Bucksbaum | Nov. 20, 1956 |
| 2,929,033 | Ellis | Mar. 15, 1960 |

FOREIGN PATENTS

| | | |
|---|---|---|
| 1,049,282 | France | Aug. 19, 1953 |